United States Patent
McKinstry et al.

(10) Patent No.: US 7,848,052 B2
(45) Date of Patent: Dec. 7, 2010

(54) USE OF GRATING STRUCTURES TO CONTROL ASYMMETRY IN A MAGNETIC SENSOR

(75) Inventors: Kevin D. McKinstry, Denver, CO (US); John P. Nibarger, Superior, CO (US)

(73) Assignee: Storage Technology Corporation, Louisville, CO (US)

( * ) Notice: Subject to any disclaimer, the term of this patent is extended or adjusted under 35 U.S.C. 154(b) by 0 days.

(21) Appl. No.: 12/434,504

(22) Filed: May 1, 2009

(65) Prior Publication Data
US 2009/0213495 A1 Aug. 27, 2009

Related U.S. Application Data

(60) Division of application No. 11/317,811, filed on Dec. 23, 2005, now Pat. No. 7,545,602, which is a continuation-in-part of application No. 11/190,388, filed on Jul. 26, 2005, now abandoned.

(51) Int. Cl.
*G11B 5/33* (2006.01)
(52) U.S. Cl. .................. 360/110; 360/313; 360/122; 360/125.01
(58) Field of Classification Search ......... 360/327, 360/110, 313, 324, 324.1, 122, 125.01
See application file for complete search history.

(56) References Cited

U.S. PATENT DOCUMENTS

| | | | |
|---|---|---|---|
| 4,047,236 A | 9/1977 | Lee | |
| 4,295,173 A * | 10/1981 | Romankiw et al. | 360/125.53 |
| 4,438,470 A | 3/1984 | Sawada et al. | |
| 4,477,794 A | 10/1984 | Nomura et al. | |
| 4,613,918 A | 9/1986 | Kanai et al. | |
| 4,649,447 A * | 3/1987 | Huang et al. | 360/327.1 |
| 4,663,683 A | 5/1987 | Youda et al. | |
| 4,683,508 A * | 7/1987 | Jeffers et al. | 360/327 |
| 4,967,598 A | 11/1990 | Wakatsuki et al. | |
| 5,055,786 A | 10/1991 | Wakatsuki et al. | |
| 5,216,363 A | 6/1993 | Masaaki | |
| 5,243,280 A | 9/1993 | Kusumi | |
| 5,530,608 A | 6/1996 | Aboaf et al. | |
| 5,589,278 A | 12/1996 | Kamijo | |
| 5,745,978 A | 5/1998 | Aboaf et al. | |
| 5,780,176 A | 7/1998 | Iwasaki et al. | |
| 5,783,284 A | 7/1998 | Shinjo et al. | |

(Continued)

FOREIGN PATENT DOCUMENTS

JP 58027386 A 2/1983

(Continued)

OTHER PUBLICATIONS

Asada et al., "Micromagnetic Study of Domain Wall Pinning Characteristics With Grooves in Thin Films", pp. 1-3.

(Continued)

*Primary Examiner*—Jefferson Evans
(74) *Attorney, Agent, or Firm*—Brooks Kushman P.C.

(57) ABSTRACT

The present invention provides apparatus and method for controlling the asymmetrical properties of the response of a magnetic sensor element to a magnetic field produced by the digital data in a magnetic storage device. The present invention also provides an apparatus and method for controlling the bias point of a magnetic field produced by a magnetic sensor element.

3 Claims, 6 Drawing Sheets

U.S. PATENT DOCUMENTS

| | | |
|---|---|---|
| 6,038,106 A | 3/2000 | Aboaf et al. |
| 6,075,360 A | 6/2000 | Mouchot et al. |
| 6,118,623 A | 9/2000 | Fatula, Jr. et al. |
| 6,230,389 B1 * | 5/2001 | Zhu .................. 29/603.1 |
| 6,646,830 B2 | 11/2003 | Biskeborn et al. |
| 6,970,331 B1 | 11/2005 | He et al. |
| 7,118,814 B1 | 10/2006 | Arnold et al. |
| 7,189,583 B2 | 3/2007 | Drewes |
| 7,256,969 B1 | 8/2007 | Arnold et al. |
| 7,450,353 B2 | 11/2008 | Pappas et al. |
| 7,495,871 B1 | 2/2009 | Nibarger et al. |
| 7,545,602 B1 | 6/2009 | McKinstry et al. |
| 7,582,890 B2 * | 9/2009 | Ha et al. ................. 257/9 |
| 2003/0107849 A1 * | 6/2003 | Ikarashi ............ 360/324.1 |

OTHER PUBLICATIONS

Da Silva et al., "Zigzag-Shaped Magnetic Sensors", Applied Physics Letters, vol. 85, No. 24, Dec. 2004, pp. 6022-6024.

* cited by examiner

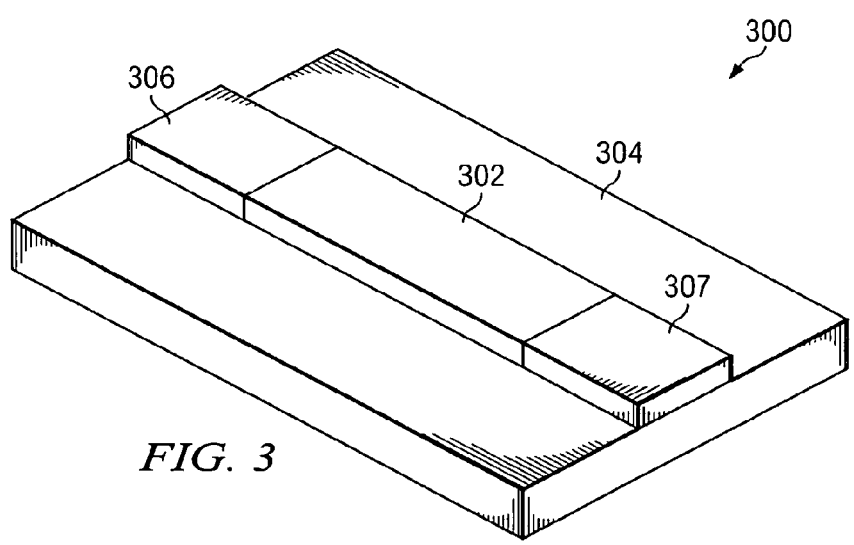

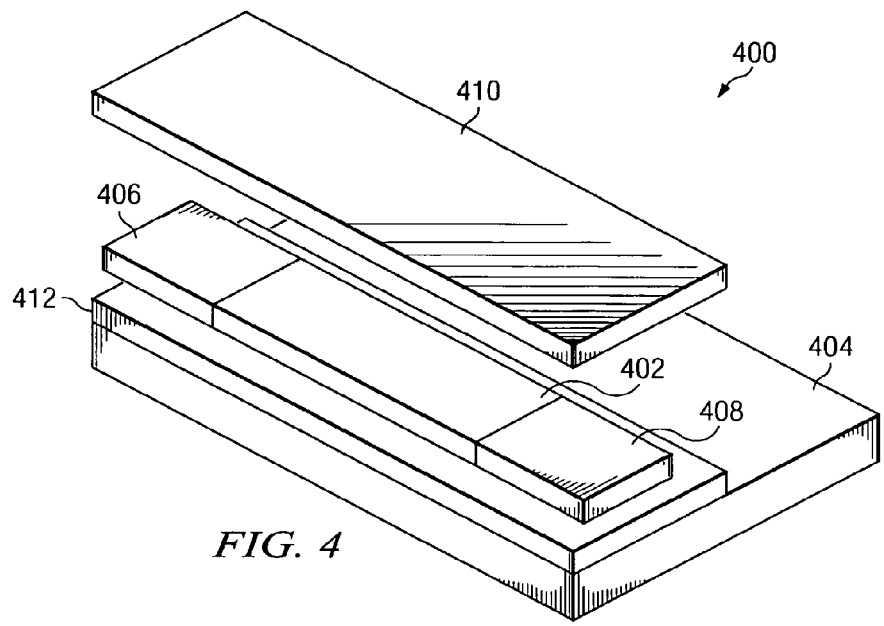
FIG. 4
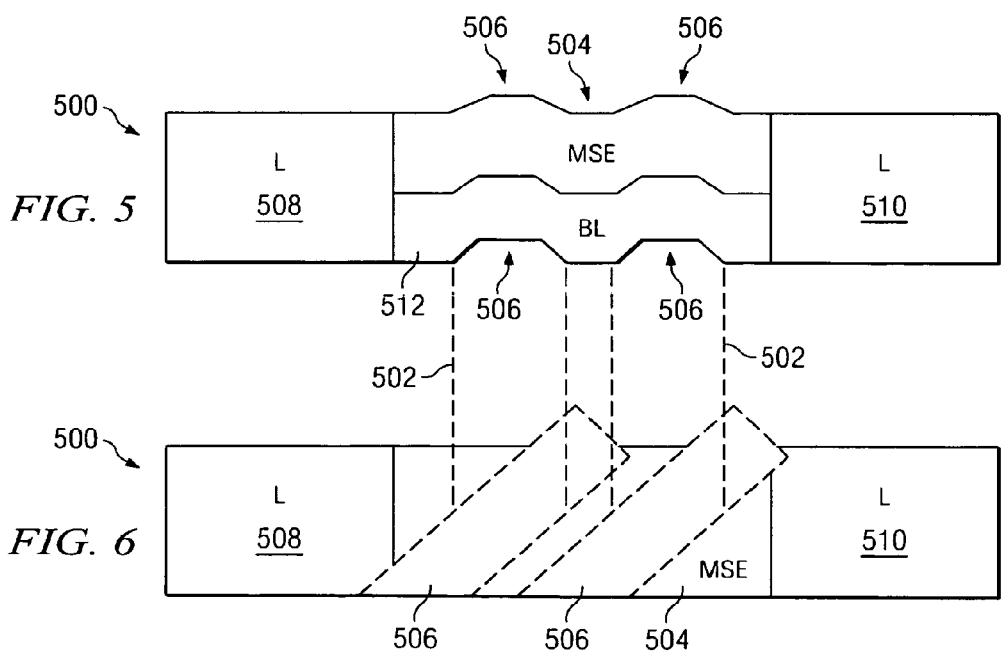
FIG. 5
FIG. 6

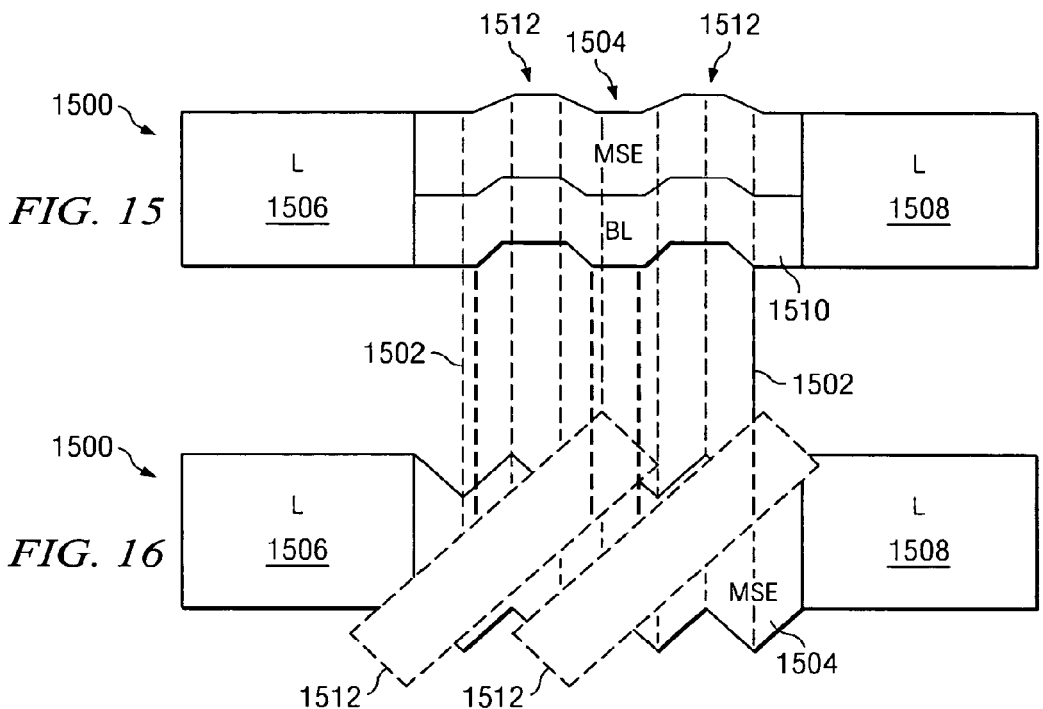
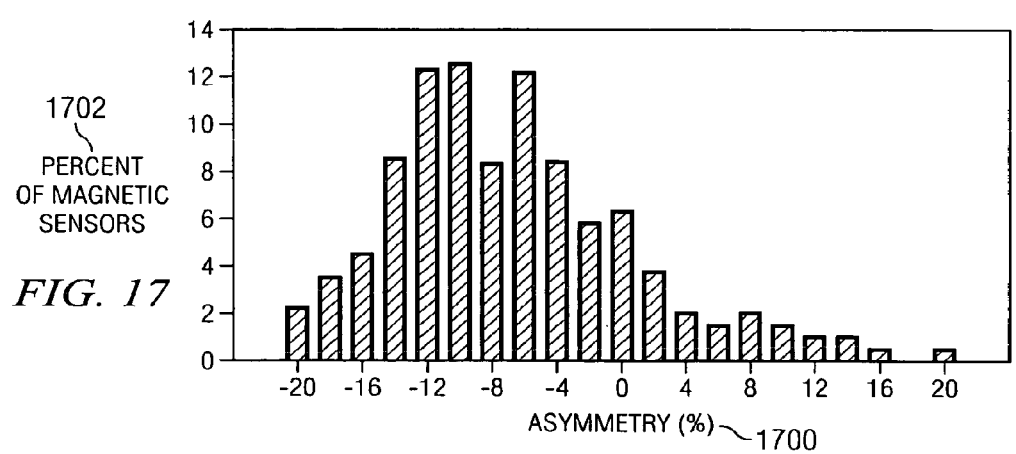

US 7,848,052 B2

USE OF GRATING STRUCTURES TO CONTROL ASYMMETRY IN A MAGNETIC SENSOR

This application is a divisional of U.S. patent application Ser. No. 11/317,811 filed Dec. 23, 2005, which is a continuation-in-part of U.S. patent application Ser. No. 11/190,388 filed Jul. 26, 2005.

BACKGROUND OF THE INVENTION

1. Field of the Invention

The present invention relates generally to sensors for detecting magnetic fields.

2. Description of the Related Art

Magnetic storage media, such as magnetic storage tape drives and hard drives, rely on magnetic sensors to read data contained within the storage media. The magnetic sensor detects variations in a sensed magnetic field as the sensor passes over the media. The variations in the magnetic field may be used to read the data contained on the storage media.

The sensitivity, reliability, and stability of magnetic sensors to measure magnetic fields in storage media applications is limited by spacing losses between the media and magnetoresistive sensor and by signal distortion arising from the sensor. In addition, the lack of sensitivity and signal distortion of magnetic sensors can be problematic in other applications, such as sensing the integrity of current carrying aluminum or ferrous metal weld joints and forensic investigations of audio tape and hard drives. Therefore, it would be advantageous to have an improved apparatus and method for increasing the sensitivity, detection reliability, and stability of magnetic sensors.

In addition, asymmetry of the response of a magnetic sensor to presents a problem to accurately reading the information stored in the magnetic fields of a magnetic storage device. In addition, controlling the bias point and asymmetry of a magnetic sensor can result in increasing the effectiveness of a magnetic sensor. Therefore, it would be advantageous to have an improved apparatus and method for reducing the asymmetrical properties of magnetic sensors' response and controlling the bias point of magnetic sensors.

SUMMARY OF THE INVENTION

The present invention provides an apparatus and method for increasing the sensitivity, detection reliability, and stability of magnetic sensors relative to different magnetic detecting applications. The present invention includes a substrate and one or more leads disposed on the substrate. A magnetic sensor is disposed on the substrate and operably connected to one or more leads. The magnetic sensor may be either a contact bearing surface magnetic sensor or a proximity magnetic sensor. The magnetic sensor may also have a zigzag shape, a grating, or both a zigzag shape and a grating.

In addition, the present invention provides an apparatus and method for controlling asymmetry of a response of a magnetic sensor. First, a grating is established on a magnetic sensor. Second, properties of the grating to control the asymmetry of the response of the magnetic field of the magnetic sensor.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 shows three different types of proximity magnetic sensors, in accordance with illustrative embodiments of the present invention;

FIG. 2 shows three different types of contact bearing surface magnetic sensors, in accordance with illustrative embodiments of the present invention;

FIG. 3 shows a prior art proximity magnetic sensor;

FIG. 4 shows a prior art contact bearing surface magnetic sensor;

FIG. 5 shows a prior art contact bearing surface magnetic sensor having a grating;

FIG. 6 shows a prior art contact bearing surface magnetic sensor having a grating;

FIG. 15 shows a proximity magnetic sensor having a hybrid zigzag grating, in accordance with an illustrative embodiment of the present invention; and FIG. 16 shows a proximity magnetic sensor having a hybrid zigzag grating, in accordance with an illustrative embodiment of the present invention.

FIG. 17 is a graph showing the asymmetrical properties of a group of magnetic sensor elements of a magnetic sensor that does not have gratings, in accordance with an illustrative embodiment of the present invention;

DETAILED DESCRIPTION OF THE PREFERRED EMBODIMENT

With reference now to the figures and in particular with reference to FIG. 1, three different types of proximity magnetic sensors are shown in accordance with illustrative embodiments of the present invention. A proximity magnetic sensor is a magnetic sensor that does not physically contact a surface over which the sensor passes. The proximity magnetic sensor senses a magnetic field that passes near or through the sensor and senses changes in the magnetic field as the proximity magnetic sensor passes over a magnetic surface.

The proximity magnetic sensors shown in FIG. 1 have three configurations. Each configuration utilizes different stabilization techniques for sensing a magnetic field and in general requires bias currents for proper biasing. Proper biasing is required to encourage a linear input-output response and is commonly accomplished through the use of current, geometry, and fields from additional magnetic materials.

Proximity magnetic sensor 100 is a proximity magnetic sensor having a grating. A grating is a periodic stepped structure having one or more interconnected parallel planes as shown, for example, in FIG. 5, and is disposed with respect to the magnetic sensor. A grating is disposed with respect to a magnetic sensor if the grating is in the magnetic sensor, on the magnetic sensor, or otherwise placed in relation to the magnetic sensor such that the grating influences the magnetization of the magnetic sensor or the response of the magnetic sensor to a magnetic field.

Figure 13:
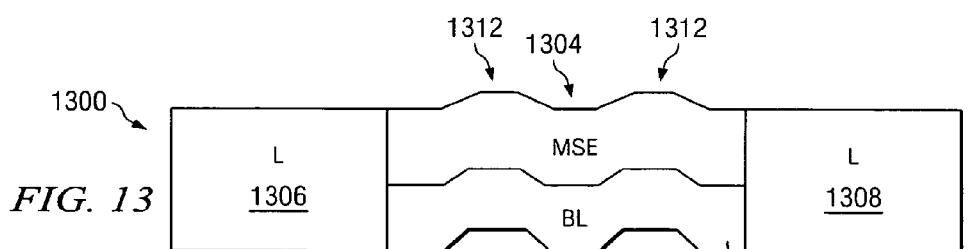
FIG. 13 shows a proximity magnetic sensor having a grating, in accordance with an illustrative embodiment of the present invention.
Figure 14:
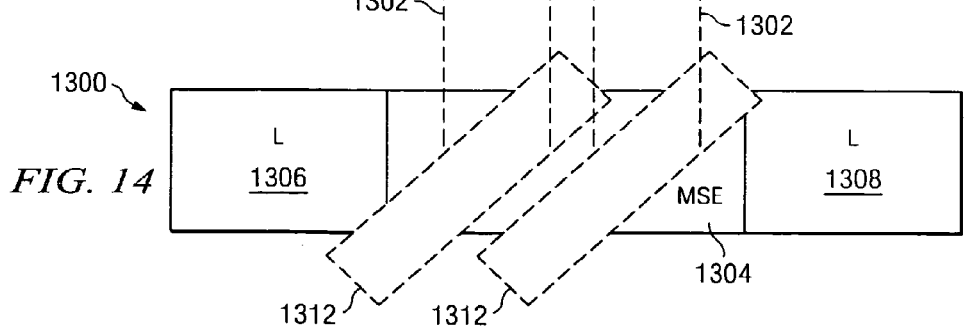
FIG. 14 shows a proximity magnetic sensor having a grating, in accordance with an illustrative embodiment of the present invention.

Proximity magnetic sensor 100 is shown and described in more detail in FIG. 13 and FIG. 14. Proximity magnetic sensor 102 is a proximity magnetic sensor having a zigzag shape. Proximity magnetic sensor 102 is shown and described in more detail in FIG. 7 and FIG. 8. Proximity magnetic sensor 104 is a proximity magnetic sensor having both a grating and a zigzag shape. In this sense, proximity magnetic sensor 104 may be referred to as a hybrid proximity magnetic sensor. Proximity magnetic sensor 104 is shown and described in more detail in FIG. 15 and FIG. 16.

FIG. 2 shows three different types of contact bearing surface magnetic sensors, in accordance with illustrative embodiments of the present invention. A contact bearing surface (CBS) magnetic sensor is a magnetic sensor that physically contacts a surface over which the sensor passes. Thus, the contact bearing magnetic sensor may be used to read magnetic tapes, in which case the contact bearing magnetic sensor may be referred to as a tape bearing surface (TBS) magnetic sensor. The contact bearing magnetic sensor senses a magnetic field that passes near or through the sensor and senses changes in the magnetic field as the contact bearing magnetic sensor passes over a magnetic surface, such as a magnetic storage tape. Thus, the contact bearing magnetic sensors shown in FIG. 2 may be adapted to bear against the surface of a magnetic tape, magnetic hard drive, or other magnetic surfaces. The contact bearing is commonly lapped during fabrication to expose the sensor to the magnetic media.

The contact bearing magnetic sensors shown in FIG. 2 have three configurations. Each configuration has different properties for sensing a magnetic field. Contact bearing magnetic sensor 200 is a contact bearing magnetic sensor having a grating. Contact bearing magnetic sensor 200 is shown and described in more detail in FIG. 5 and FIG. 6. Contact bearing magnetic sensor 202 is a contact bearing magnetic sensor having a zigzag shape. Contact bearing magnetic sensor 202 is shown and described in more detail in FIG. 9 and FIG. 10. Contact bearing magnetic sensor 204 is a contact bearing magnetic sensor having both a grating and a zigzag shape. In this sense, contact bearing magnetic sensor 204 may be referred to as a hybrid contact bearing magnetic sensor. Contact bearing magnetic sensor 204 is shown and described in more detail in FIG. 11 and FIG. 12.

FIG. 3 shows a prior art proximity magnetic sensor. Proximity magnetic sensor 300 includes sensor element 302 deposited or placed on substrate 304. Magnetic sensor element 302 may be a variety of materials, such as Nickel-Iron alloys and may be a complex composite of layers of materials. Substrate 304 may be made from a variety of materials, including AlTiC composites, alumina, and glass.

Sensor element 302 is attached to one or more leads 306 and 308. Leads 306 and 308 may be formed from conductive materials, which also may be magnets. Leads 306 and 308 allow magnetic signals sensed in sensing element 302 to be transmitted to a means for translating the sensed magnetic signals into meaningful data, such as a data processing system or other hardware or software.

FIG. 4 shows a prior art contact bearing surface magnetic sensor. Contact bearing surface magnetic sensor 400 includes a sensor element 402 deposited or placed on substrate 404. Magnetic sensor element 402 may be a variety of materials, such as Nickel-Iron alloys and may be a complex composite of layers of materials. Substrate 404 may be made from a variety of materials, including AlTiC composites, alumina, and glass.

Sensor element 402 is attached to one or more leads 406 and 408. Leads 406 and 408 may be formed from conductive materials, which also may be magnets. Leads 406 and 408 allow magnetic signals sensed in sensing element 402 to be transmitted to a means for translating the sensed magnetic signals into meaningful data, such as a data processing system or other hardware or software. In addition, contact bearing surface magnetic sensor 400 includes one or more shields, such as shield 410 and shield 412 for shielding sensor element 402 from extraneous magnetic signals. In an illustrative embodiment, two shields are used, one placed between sensor element 402 and substrate 404 and the other, shield 410, placed on the other side of sensor element 402 opposite shield 412. Shields 410 and 412 may be formed from Nickel-Iron alloys, Iron Silicon Aluminum alloys, nitrided Iron, or large permeability Cobalt based alloys.

In general, a number of fundamental differences exist between proximity magnetic sensors, such as those shown in FIG. 1 and FIG. 3, and contact bearing magnetic sensors, such as those shown in FIG. 2 and FIG. 4. A proximity magnetic sensor is omni-directional, whereas the contact bearing magnetic sensor is directional. The contact bearing magnetic has shields which allow the sensor to favor detection of magnetic field components only in the direction perpendicular to the axis of the magnetic sensor and reject extraneous magnetic fields nearby to improve the resolution of magnetic bits directly opposite sensor element 402. On the other hand, the proximity magnetic sensor can measure magnetic fields in various directions and, for this reason, is unshielded and has a correspondingly decreased spatial resolution of sensed magnetic fields.

Few practitioners in the art of magnetic sensors work with both omni-directional and direction-sensitive magnetic field sensors. Most practitioners work with either one type or the other. For example, a practitioner in directional, shielded magnetic sensors would be motivated to avoid removing the shields from the magnetic sensor because removing the shields removes the ability to have high spatial resolution of tape or disk recorded bits of information. On the other hand, a practitioner in omni-directional, unshielded magnetic sensors would be motivated to avoid using shields in the first place because shields reduce the total sensitivity of the magnetic sensor and the resultant signal.

In addition, stabilization techniques used in a directional sensor will not necessarily be applicable to an omni-directional sensor. Stabilization techniques are used to improve sensor reliability and/or minimize sensor-induced signal distortion, although they simultaneously reduce sensor magnetic field sensitivity. In most cases, if not all cases, proximity magnetic sensor practitioners also desire quantitative field detection and so would desire to minimize sensor distortion. However, if implemented, this desire would result in the expense of being able to maximize field detection sensitivity. Examples of these differences include size effects, mechanical stresses, and machining stresses during formation of the contact bearing.

Further exacerbating the differences between directional and omni-directional magnetic sensor, the application scale and manufacturability of the two types of magnetic sensors are distinct. Directional magnetic sensors, including contact bearing magnetic sensors, are designed for use in high recording density applications. For example, contact bearing magnetic sensors use magnetic shields to improve the recorded bit or transition spatial resolutions. Thus, contact bearing magnetic sensors are small, between about one-tenth and ten micrometers. On the other hand, proximity magnetic sensors are larger, between about ten and one hundred micrometers, do not use shields, and are designed for high field presence or absence discrimination in field sensing applications.

The manufacturing techniques for each type of sensor are generally equivalent in principle. However, the manufacturing techniques of 10-100 micrometer sensors typically do no support the vertical sidewall angle definition required for an effective grating, while the typical manufacturing processing of the 0.1 to 10 micrometer sensors are optimized to produce vertical sidewall angles at numerous processing levels. Examples of the latter type of sensor include ion milled shields and poles and abutted junctions. Thus, processes supporting vertical sidewall angles would not typically be practiced by those experienced in photolithographic techniques at larger scales, such as from 10-100 micrometers. For these reasons, and because each type of magnetic sensor generally has different applications, practitioners in the art of magnetic sensors do not use or work with both proximity and contact bearing magnetic sensors.

FIG. 5 and FIG. 6 show a contact bearing surface (CBS) magnetic sensor having a grating. Examples of the contact bearing magnetic sensors shown in FIG. 5 and FIG. 6 are shown in U.S. Pat. Nos., such as 6,038,108, 5,745,978, and 5,530,608, as well as in our application Ser. Nos. 10/244,011, 10/791,257, and 10/862,287. The contact bearing magnetic sensor having a grating shown in FIG. 5 and FIG. 6 corresponds to contact bearing magnetic sensor 200 shown in FIG. 2. Reference numerals in FIG. 5 and FIG. 6 correspond to each other to show that each figure shows a different view of the same magnetic sensor. FIG. 5 shows a cross section of the magnetic sensor and FIG. 6 shows a bottom view of the magnetic sensor. Alternatively, FIG. 6 could serve to represent a top view of the magnetic sensor. Phantom lines 502 show the correspondence between the grating surfaces in the two different views.

Contact bearing magnetic sensor 500 is built on a substrate, as shown in FIG. 3 and FIG. 4, though not shown in FIG. 5 and FIG. 6. First and second shields are provided, as shown in FIG. 3 and FIG. 4, though not shown in FIG. 5 and FIG. 6.

Magnetic sensor element (MSE) 504 has grating 506 placed into the element. Magnetic sensor 504 is used to sense the magnetic field of an object bearing on the surface of the sensor. Grating 506 aids in controlling sensor stabilization and sensitivity by controlling the local direction of sensor magnetization relative to the local current direction.

Grating 506 can also be used to control asymmetrical properties of the response of a magnetic sensor to a magnetic field emanating from the magnetic storage media. The grating induces an additional field that changes the response of the sensor, as described further below. The magnetic fields that are present provide a means of properly biasing the sensor. The magnetic field induced by the grating is just one of the many fields involved. However, the magnetic field induced by the grating can control the asymmetry and bias point in a way that is not possible using other techniques.

Other effective magnetic fields that are present include fields from the shape of the element (shape anisotropy field), the bias current flowing through the element (Oersted field from the current), adjacent soft magnetic films (the soft adjacent layer (SAL) biasing technique), hard magnetic films (as a permanent magnet that controls the domains of the element where the current goes in or comes out of the element or as vertical biasing method), or an exchange biased layer (through an antiferromagnet). The effective fields that are present control the response of the sensor. The grating induces an additional field that changes the response of the sensor.

One reason that the grating can additionally affect the asymmetry of the response of the sensor is that the field is not uniform and does not spatially vary. One of the important response characteristics is the asymmetry and this can be controlled through the physical geometry of the grating. The physical geometry characteristics to control the grating and the effect of the grating include the depth of the grating, the wall angle of the grating, and the number of transitions in the grating. Each of these characteristics can be adjusted to control asymmetrical properties of the response of a magnetic sensor to a magnetic field emanating from the magnetic storage media.

By reducing the asymmetrical properties of magnetic sensor 504, the sensitivity and accuracy of magnetic sensor 504 is increased. Through the use of the grating, magnetic sensor 504 has a response that is more linear. The higher the linearity of the response of magnetic sensor 504, the lower the asymmetry in the response of sensor 504. The degree of change in the asymmetry in the response of sensor 504 varies depending on the geometrical characteristics of the grating, as described above.

Thus, a grating can be established on a magnetic sensor using a number of known techniques. The grating can also be established using top-milling techniques shown in our application Ser. No. 11/190,040 filed Jul. 26, 2005. The properties of the grating can be controlled to control the asymmetry of the response of the magnetic field of the magnetic sensor in the manner described above. In a similar manner, the grating can be adapted to control the asymmetry of the response of the magnetic field.

In addition, grating 506 can also be used to control the bias point of a magnetic field of magnetic sensor 504 in a manner similar to that described for controlling the asymmetry in the response of sensor 504. The grating is controlled or adapted to adjust the bias point of the magnetic field. By controlling the bias point of the magnetic field of magnetic sensor 504, the sensitivity and accuracy of magnetic sensor 504 is increased.

In addition, leads (L) 508 and 510 are operably connected to magnetic sensor element 504 and are disposed between the first and shields. The term "operably connected" means that two or more elements are connected in a manner such that all elements may operate in an intended or desired manner. Thus, because leads 508 and 510 are operably connected to magnetic sensor element 504, the leads are in some way connected to the sensor element, perhaps via a separate element, that allows the leads to receive electromagnetic signals from the magnetic sensor element, and visa versa.

Leads 508 and 510 transmit electrical signals corresponding to a sensed magnetic field to a means for reading the sensed magnetic field. Leads 508 and 510 also serve to conduct electric current to provide the sensor base monitored voltage. The means for reading the sensed magnetic field include a data processing system, hardware, software, communication links, and other components used in transmitting and processing signals corresponding to the sensed magnetic field. Leads 508 and 510 may also be operably connected to a data processing system adapted to convert electrical signals corresponding to the sensed magnetic field into data or a datum representing the magnetic field. The data representing the magnetic field may be used to construct a representation of the magnetic field.

In addition, magnetic sensor 500 includes a biasing layer (BL) 512, which is used to create a vertical axis, or top-bottom axis, biasing magnetic field that is applied to magnetic sensor 500. Biasing layer 512 may be a soft adjacent layer and may be formed from materials such as CoZrMo, CoZrNb, NiFeRh, NiFeCr, and NiFe, and may be other kinds of materials depending on the nature of the biasing layer.

As the magnetic sensor moves relative to the object being sensed, the sensor detects changes in the magnetic field. The rotation of the sensor magnetization with respect the current direction gives rise to a change in the voltage. In turn, sensed changes in the voltage may be converted into data representing information or data stored on the object or into data representing information about the object. Thus, a magnetic sensor may be used to read information or data from a magnetic storage device or may be used to determine features of an object based on the measured magnetic field.

Figure 7:
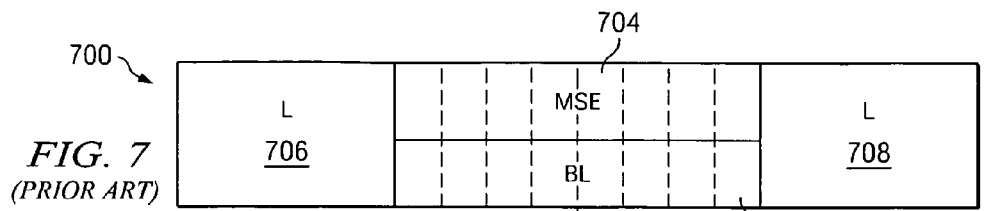
FIG. 7 shows a prior art proximity magnetic sensor having a zigzag shape.
Figure 8:
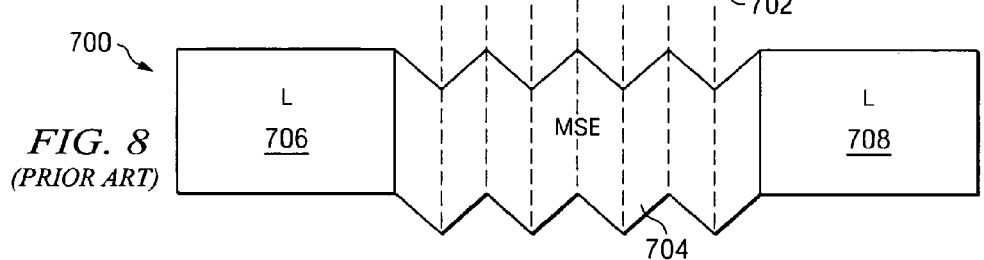
FIG. 8 shows a prior art proximity magnetic sensor having a zigzag shape.

FIG. 7 and FIG. 8 show a proximity magnetic sensor having a zigzag shape. Other examples of magnetic sensors having a zigzag proximity magnetic sensor may be found in DaSilva et al., "Zigzag-shaped Magnetic Sensors", Applied Physics Letters, Vol. 85, No. 24, December 2004, pp.6022-6024.

The proximity magnetic sensor having a zigzag shape shown in FIG. 7 and FIG. 8 corresponds to magnetic sensor 102 shown in FIG. 1. Reference numerals in FIG. 7 and FIG. 8 correspond to each other to show that each figure shows a different view of the same magnetic sensor. FIG. 7 shows a cross section of the magnetic sensor and FIG. 8 shows a bottom view of the magnetic sensor. Phantom lines 702 show the correspondence between the zigzag surfaces in the two different views.

Magnetic sensor 700 shown in FIG. 7 and FIG. 8 is built on a substrate, not shown, in a manner similar to that described in regard to FIG. 3 through FIG. 6. Similarly, magnetic sensor 700 is provided with leads (L) 706 and 708, as well as biasing layer (BL) 710. Leads 706 and 708 and biasing layer 710 are disposed and structured similarly to corresponding components described in FIG. 3 through FIG. 6.

Proximity magnetic sensor element (MSE) 704 is provided with a zigzag shape. The zigzag shape of proximity magnetic sensor element 704 creates a variation in the shape anisotropy through a change in the sensor's local shape in the magnetic recording convention y-z plane. Shape anisotropy refers to a phenomenon where the favored direction of magnetization of a sensor lies parallel to the longest sensor dimension. For magneto-resistive based sensors, minimum distortion and maximum signal sensitivity occur when the direction between the local magnetization and local current direction is close to 45 degrees. The detected magnetic field changes the sensor magnetization, which in turn changes the sensor local resistivity. The detected magnetic field is then observed as a signal voltage change.

Figure 9:
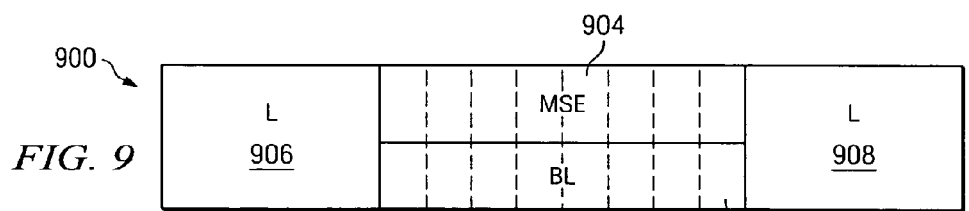
FIG. 9 shows a contact bearing surface magnetic sensor having zigzag shape, in accordance with an illustrative embodiment of the present invention.
Figure 10:
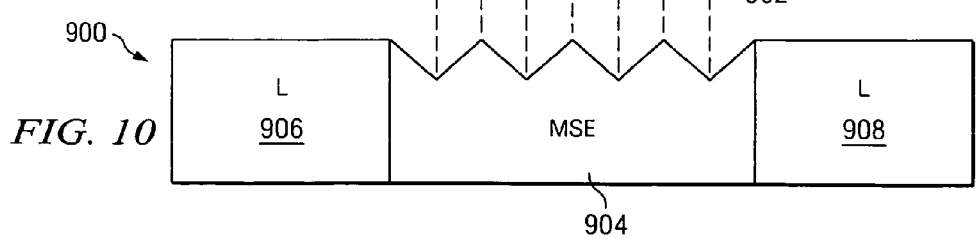
FIG. 10 shows a contact bearing surface magnetic sensor having zigzag shape, in accordance with an illustrative embodiment of the present invention.

FIG. 9 and FIG. 10 show a contact bearing surface (CBS) magnetic sensor having a zigzag shape, in accordance with an illustrative embodiment of the present invention. Contact bearing magnetic sensor having a zigzag shape 900 shown in FIG. 9 and FIG. 10 corresponds to the magnetic sensor 202 shown in FIG. 2. Reference numerals in FIG. 9 and FIG. 10 correspond to each other to show that each figure shows a different view of the same magnetic sensor. FIG. 9 shows a cross section of the magnetic sensor and FIG. 10 shows a bottom view of the magnetic sensor. Phantom lines 902 show the correspondence between the zigzag surfaces in the two different views.

Contact bearing magnetic sensor 900 shown in FIG. 9 and FIG. 10 is built on a substrate, not shown, in a manner similar to that described in regard to FIG. 3 through FIG. 6. Contact bearing magnetic sensor 900 shown in FIG. 9 and FIG. 10 also includes shields, not shown, in a manner similar to that described in regard to FIG. 3 through FIG. 6. Similarly, contact bearing magnetic sensor 900 is provided with leads (L) 906 and 908, as well as biasing layer (BL) 910. Leads 906 and 908 and biasing layer 910 are disposed and structured similarly to corresponding components described in FIG. 3 through FIG. 6.

Magnetic sensor element (MSE) 904 has a zigzag shape. The zigzag shape of magnetic sensor element 904 creates a variation in the shape anisotropy of the magnetic sensor through a change in the sensor's local shape in the magnetic recording convention y-z plane.

Contact bearing magnetic sensor 900 is designed to operate in a manner which ensures that the local sensor magnetization is always nearly 45 degrees relative to the direction of the local current. Because the direction of local current is generally directed from one current lead to the other, sensor zigzag configuration, sensor grating orientation, and sensor shape-induced anisotropy are all such that the local magnetization of the sensor is at 45 degrees relative to the local current direction. Constraining the sensor in this manner minimizes detected signal distortion and increases sensor reliability, but decreases magnetic field detection sensitivity.

The zigzag shape of the magnetic sensor element is more effective in proximity magnetic sensors compared to contact bearing magnetic sensors, because in-contact field detection applications do not allow the zigzag shape to be maintained on the sensor side that comes in contact with a surface. However, the zigzag shape of the magnetic sensor element 904 of contact bearing magnetic sensor 900 still minimizes detected signal distortion and increases sensor reliability.

Figure 11:
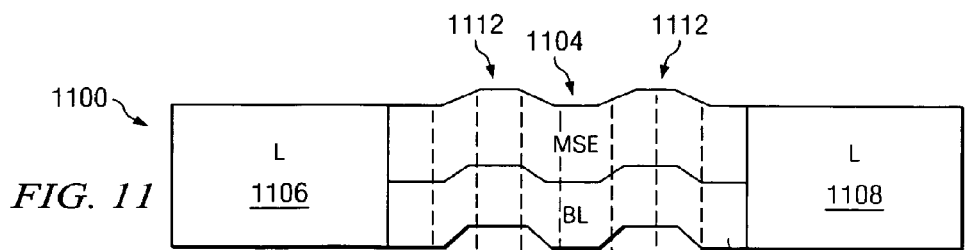
FIG. 11 shows a contact bearing surface magnetic sensor having a hybrid zigzag grating, in accordance with an illustrative embodiment of the present invention.
Figure 12:
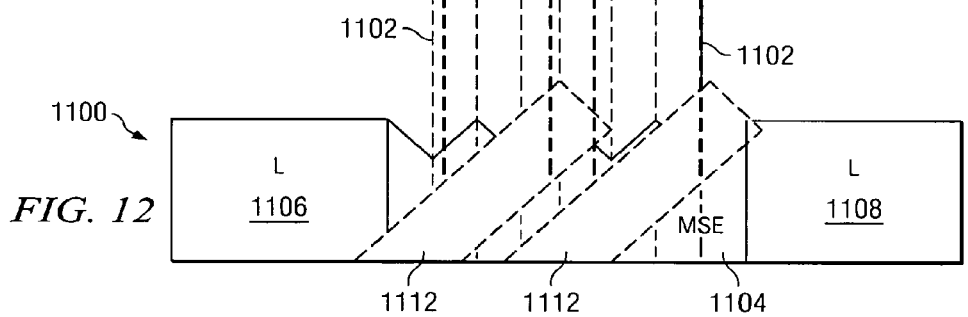
FIG. 12 shows a contact bearing surface magnetic sensor having a hybrid zigzag grating, in accordance with an illustrative embodiment of the present invention.

FIG. 11 and FIG. 12 show a contact bearing surface (CBS) magnetic sensor having a hybrid zigzag grating, in accordance with an illustrative embodiment of the present invention. The contact bearing magnetic sensor 1100 having a zigzag shape with grating shown in FIG. 11 and FIG. 12 corresponds to the magnetic sensor 204 shown in FIG. 2. Reference numerals in FIG. 11 and FIG. 12 correspond to each other to show that each figure shows a different view of the same magnetic sensor. FIG. 11 shows a cross section of the magnetic sensor and FIG. 12 shows a bottom view of the magnetic sensor. Phantom lines 1102 show the correspondence between the zigzag surfaces and gratings in the two different views.

Contact bearing magnetic sensor 1100 shown in FIG. 11 and FIG. 12 is built on a substrate, not shown, in a manner similar to that described in regard to FIG. 3 through FIG. 6. Contact bearing magnetic sensor 1100 shown in FIG. 11 and FIG. 12 also includes shields, not shown, in a manner similar to that described in regard to FIG. 3 through FIG. 6. Similarly, contact bearing magnetic sensor 1100 is provided with leads (L) 1106 and 1108, as well as biasing layer (BL) 1110. Leads 1106 and 1108 and biasing layer 1110 are disposed and structured similarly to corresponding components described in FIG. 3 through FIG. 6.

Magnetic sensor element (MSE) 1104 shown in FIG. 11 and FIG. 12 has zigzag shape and grating 1112. The zigzag shape of magnetic sensor element 1104 creates a variation in the shape anisotropy of the magnetic sensor through a change in the sensor's local shape in the magnetic recording convention y-z plane. The addition of grating 1112 further strengthens the sensor biasing, but by exploiting a different feature of the same phenomenon where local magnetic sensor magnetization configuration is governed by sensor boundary shape and by internal localized shape variations. Both the zigzag shape and the sensor grating serve to constrain the local magnetization to a near 45 degree angle to the electric current which flows parallel to the z direction.

FIG. 13 and FIG. 14 show a proximity magnetic sensor having a grating, in accordance with an illustrative embodiment of the present invention. The proximity magnetic sensor 1300 having a zigzag shape shown in FIG. 13 and FIG. 14 corresponds to magnetic sensor 100 shown in FIG. 1. Reference numerals in FIG. 13 and FIG. 14 correspond to each other to show that each figure shows a different view of the same magnetic sensor. FIG. 13 shows a cross section of the magnetic sensor and FIG. 14 shows a bottom view of the magnetic sensor. Phantom lines 1302 show the correspondence between the gratings in the two different views.

Proximity magnetic sensor 1300 shown in FIG. 13 and FIG. 14 is built on a substrate, not shown, in a manner similar to that described in regard to FIG. 3 through FIG. 6. Similarly, proximity bearing magnetic sensor 1300 is provided with leads (L) 1306 and 1308, as well as biasing layer (BL) 1310. Leads 1306 and 1308 and biasing layer 1310 are disposed and structured similarly to corresponding components described in FIG. 3 through FIG. 6.

Magnetic sensor element (MSE) 1304 shown in FIG. 13 and FIG. 14 is provided with grating 1312. The grating allows an improvement in sensor stabilization in detecting magnetic fields compared with the zigzag structures shown in FIG. 7 and FIG. 8, and greater field detection sensitivity than with the structures shown in FIG. 5 and FIG. 6 which possess the shields shown in FIG. 4.

FIG. 15 and FIG. 16 show a proximity magnetic sensor having a hybrid zigzag grating, in accordance with an illustrative embodiment of the present invention. Proximity magnetic sensor 1500 having a zigzag shape and grating shown in FIG. 15 and FIG. 16 corresponds to magnetic sensor 104 shown in FIG. 1. Reference numerals in FIG. 15 and FIG. 16 correspond to each other to show that each figure shows a different view of the same magnetic sensor. FIG. 15 shows a cross section of the magnetic sensor and FIG. 16 shows a bottom view of the magnetic sensor. Phantom lines 1502 show the correspondence between the gratings in the two different views.

Proximity magnetic sensor 1500 shown in FIG. 15 and FIG. 16 is built on a substrate, not shown, in a manner similar to that described in regard to FIG. 3 through FIG. 6. Similarly, proximity magnetic sensor 1500 is provided with leads (L) 1506 and 1508, as well as biasing layer (BL) 1510. Leads 1506 and 1508 and biasing layer 1510 are disposed and structured similarly to corresponding components described in FIG. 3 through FIG. 6.

Magnetic sensor element (MSE) 1504 shown in FIG. 15 and FIG. 16 is provided with grating 1512 and a zigzag shape. The combined zigzag shape and grating of magnetic sensor element 1504 creates a variation in the shape anisotropy of the magnetic sensor, while further strengthening the sensor bias as explained above for sensor 1104. Proximity magnetic sensor 1500 maximizes signal detection reliability, but at the expense of spatial discrimination (in contrast to magnetic sensor 1100) and signal sensitivity (in contrast to magnetic sensors 700 and 1300).

FIG. 17 is a graph showing the asymmetrical properties of a group of magnetic sensor elements of a magnetic sensor that does not have gratings, in accordance with an illustrative embodiment of the present invention. Horizontal axis 1700 shows the percentage of asymmetry observed in a group of magnetic sensors on a giant magneto-resistive read head. The asymmetry definition used here is the difference of the absolute value of the maximum signal and the absolute value of the minimum signal normalized by the sum of the absolute value of the of the maximum signal and the absolute value of the minimum signal. In other words: Asymmetry=[abs($V_+$)–abs($V_-$)]/[abs($V_+$)+abs($V_-$)]. Vertical axis 1702 shows the percentage of magnetic sensors at a particular percentage of asymmetry. As can be seen, a high total percentage of magnetic sensors have more than 8% asymmetry. In addition, the percentage of asymmetry of magnetic sensors in the read head varies between ±20 percent.

Figure 18:
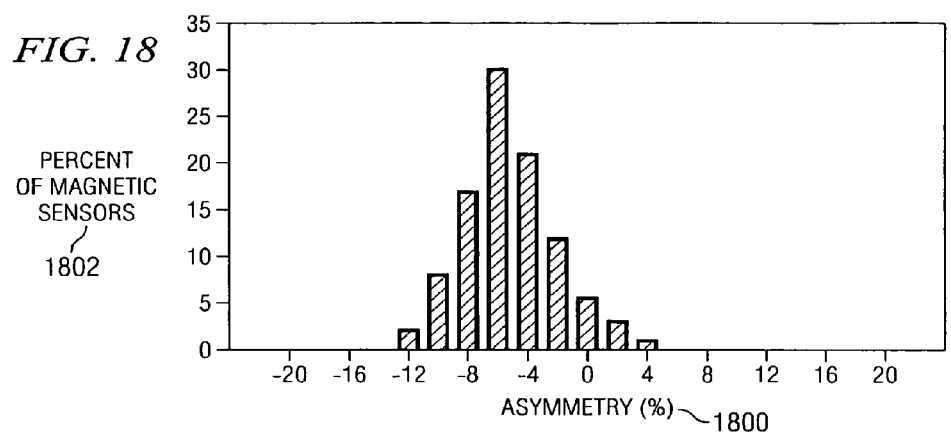
FIG. 18 is a graph showing the effect of exemplary gratings on the asymmetrical properties of the group of magnetic sensor elements shown in FIG. 17, in accordance with an illustrative embodiment of the present invention.

FIG. 18 is a graph showing the effect of exemplary gratings on the asymmetrical properties of the group of magnetic sensor elements shown in FIG. 17, in accordance with an illustrative embodiment of the present invention. A grating is a periodic stepped structure having one or more interconnected parallel planes as shown, for example, in FIG. 5, and is disposed with respect to the magnetic sensor. The grating or gratings are disposed with respect to the magnetic sensor or magnetic sensors described in FIG. 18. A grating is disposed with respect to a magnetic sensor if the grating is in the magnetic sensor, on the magnetic sensor, or otherwise placed in relation to the magnetic sensor such that the grating influences the magnetization of the magnetic sensor or the response of the magnetic sensor to a magnetic field.

As in FIG. 17, horizontal axis 1800 shows the percentage e of asymmetry observed in a group of magnetic sensors on a giant magneto-resistive read head. Vertical axis 1802 shows the percentage of magnetic sensors at a particular percentage of asymmetry. By adding gratings to the magnetic sensors, asymmetry in the magnetic sensors is greatly reduced. The percentage of asymmetry varies only between −12% and 4%, and the bulk of magnetic sensors have an asymmetry of less than 8%.

Figure 19:
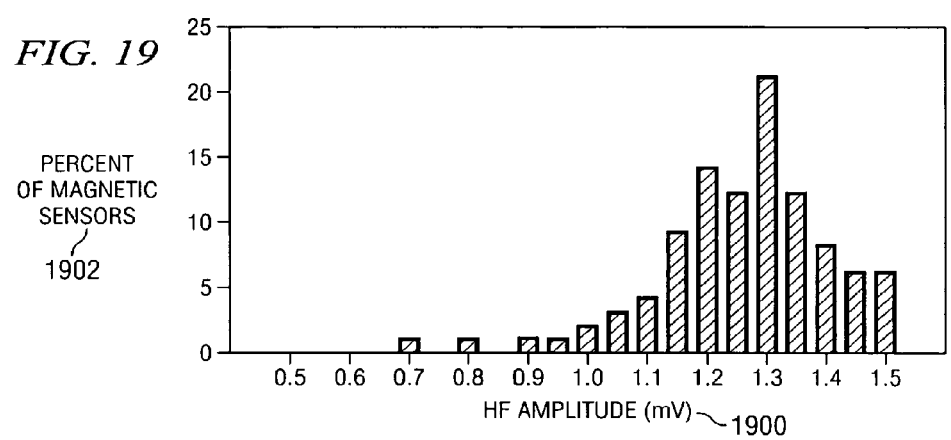
FIG. 19 is a graph showing the effect of the bias points of a group of magnetic sensor elements of a magnetic sensor that does not have gratings, in accordance with an illustrative embodiment of the present invention.

FIG. 19 is a graph showing the effect of the bias points of a group of magnetic sensor elements of a magnetic sensor that does not have gratings, in accordance with an illustrative embodiment of the present invention. Horizontal axis 1900 shows the high frequency (HF) amplitude observed in a group of magnetic sensors on an anisotropic magneto-resistive read head. The frequency refers to a written pattern of "0"s and "1"s at a frequency in which the media produces half of the output of an isolated pulse. This frequency is also referred to as the $D_{50}$ of the media. Vertical axis 1902 shows the percentage of magnetic sensors at a particular high frequency amplitude. Without the presence of gratings on the magnetic sensors, the high frequency amplitude distribution varies as shown.

Figure 20:
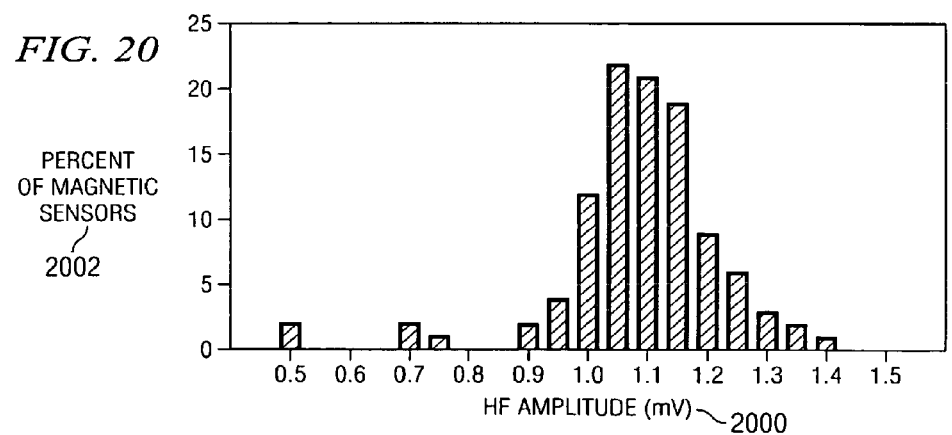
FIG. 20 is a graph showing the effect of exemplary gratings on the bias points of the group of magnetic sensor elements shown in FIG. 19, in accordance with an illustrative embodiment of the present invention.

FIG. 20 is a graph showing the effect of exemplary gratings on the bias points of the group of magnetic sensor elements shown in FIG. 19, in accordance with an illustrative embodiment of the present invention. A grating is a periodic stepped structure having one or more interconnected parallel planes as shown, for example, in FIG. 5, and is disposed with respect to the magnetic sensor. The grating or gratings are disposed with respect to the magnetic sensor or magnetic sensors described in FIG. 20. A grating is disposed with respect to a magnetic sensor if the grating is in the magnetic sensor, on the magnetic sensor, or otherwise placed in relation to the magnetic sensor such that the grating influences the magnetization of the magnetic sensor or the response of the magnetic sensor to a magnetic field.

Horizontal axis 2000 shows the HF amplitude observed in a group of magnetic sensors on an anisotropic magneto-resistive read head where the magnetic sensors are provided with gratings. Vertical axis 2002 shows the percentage of magnetic sensors at a particular high frequency amplitude. Compared to the graph shown in FIG. 19, the overall high frequency amplitudes are shifted downwardly when gratings are provided on the magnetic sensors. More importantly, more magnetic sensors are clustered about a particular high frequency amplitude; that is, 1.1 mV. The more narrow distribution of high frequency amplitudes reflects a more stable bias point for each magnetic sensor.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A magnetic sensor comprising:
   a substrate;
   at least one lead disposed on the substrate;
   a directional, contact bearing surface magnetic sensor element disposed on the substrate and operably connected to the at least one lead, the magnetic sensor element having a zigzag shape maintained on a far side of the magnetic sensor element, a near side of the magnetic sensor element that comes in contact with a surface omitting the zigzag shape; and
   a grating in the form of a periodic stepped structure disposed with respect to the magnetic sensor element, wherein the grating is adapted to control asymmetry of a response of a magnetic field produced by the magnetic sensor element, and wherein the periodic stepped structure is maintained, in addition to the zigzag shape, on the far side of the magnetic sensor element, the near side of the magnetic sensor element omitting the periodic stepped structure.

2. The magnetic sensor of claim 1 wherein the grating is further adapted to control a bias point of the magnetic field produced by the magnetic sensor element.

3. The magnetic sensor of claim 1 further comprising:
   a data processing system operably connected to the at least one lead, said data processing system adapted to convert a magnetic field sensed by the magnetic sensor element into a datum representing the magnetic field.

* * * * *